United States Patent [19]

Mansfield

[11] Patent Number: 4,689,212
[45] Date of Patent: Aug. 25, 1987

[54] METHOD FOR FORMING DOPED OPTICAL PREFORMS

[75] Inventor: Robert J. Mansfield, Stow, Mass.
[73] Assignee: Polaroid Corporation, Cambridge, Mass.
[21] Appl. No.: 863,160
[22] Filed: May 14, 1986
[51] Int. Cl.$^4$ ............................................. B05D 1/08
[52] U.S. Cl. .................................... 427/34; 427/163; 65/3.12
[58] Field of Search ................... 427/34, 163; 65/3.12; 350/96.3, 96.31

[56] References Cited

U.S. PATENT DOCUMENTS

| | | | |
|---|---|---|---|
| Re. 30,883 | 3/1982 | Rau et al. | 65/60.51 |
| 3,310,423 | 3/1967 | Ingham, Jr. | |
| 3,923,484 | 12/1975 | Randall | 65/3.12 |
| 4,221,825 | 9/1980 | Guerder et al. | 427/34 |
| 4,265,649 | 5/1981 | Achener | 65/18 |
| 4,367,013 | 1/1983 | Guerder et al. | 350/96.34 |
| 4,441,788 | 4/1984 | Guerder et al. | 350/96.34 |
| 4,493,720 | 1/1985 | Gauthier et al. | 427/34 |

Primary Examiner—John H. Newsome
Attorney, Agent, or Firm—Francis J. Caufield

[57] ABSTRACT

An optical fiber preform is formed by plasma chemical vapor deposition utilizing a plasma torch that includes a chamber into which a plasma starting gas, such as argon, is introduced and converted to a plasma by application of high frequency electromagnetic energy. A suitable entry port is provided in the torch chamber to allow dopant material in solid form to be introduced directly into the plasma for vaporization or ionization. The dopant material passes into a lower temperature region where gaseous silica precursor gases are introduced to undergo reaction in the presence of the vaporized dopant to form appropriately doped silica particles for deposition onto a substrate. Solid dopants of low volitility or vapor pressure may be used as dopants which could not otherwise be used in vapor deposition processes. The absence of hydrogen in the reaction dynamics results in a preform having greatly reduced hydroxyl ion content. If desired, a high-purity starting glass, rather than the precursor gases, can be introduced directly into the plasma to form the appropriately doped material.

11 Claims, 2 Drawing Figures

METHOD FOR FORMING DOPED OPTICAL PREFORMS

BACKGROUND OF THE INVENTION

The present invention relates generally to optical fiber waveguide fabrication. More particularly, it concerns a method and apparatus for the fabrication of optical fiber preforms using a plasma forming torch which results in improved efficiency as compared with prior systems.

Optical fiber waveguides typically include a light transmitting core surrounded by a cladding. The optical fiber is manufactured from a high-purity silica in which the index of refraction of either the cladding or the core is adjusted during manufacture to provide a lower index of refraction in the cladding than the core. Various processes have been developed for manufacturing optical fibers, many of which use a silica starting preform having the same cross sectional geometry as the finished fiber and a diameter dimension (e.g., 25 mm) that is several orders of magnitude greater than that of the finished fiber. One method of fabricating a preform involves bringing together silica precursor gases, such as silicon tetrachloride and oxygen, and heating these gases using a hydrogen fuel gas in a temperature range between 1400° and 1800° C. The precursor gases undergo a reaction to form silica particles which are deposited onto a suitable substrate or otherwise accumulated. Certain dopant materials can be added to the precursor reaction gases to alter the index of refraction of the resulting silica. For example, boron or fluorine compounds can be added to effect a lowering of the index of refraction while compounds of phosphorous or germanium can be added to effect an increase in the index of refraction. After sufficient material is deposited, the mass of deposited material can be consolidated by heating to form a clear rod that can be subjected to various physical shaping steps and then drawn in one or more drawing steps into a finished fiber.

One drawback associated with the described process is that the hydrogen fuel gas can combine with available oxygen to form hydroxyl ions (OH) in the resulting preform and the finished optical fiber. The presence of these OH ions changes the spectral absorption of the silica so that light of selected wavelengths is undesirably attenuated in the finished fiber.

In an effort to reduce the formation of undesirable OH ions consequent to the use of hydrogen fuel in the above-described silica forming reaction, an electrically generated plasma has been used as the heat source for the reaction so that the silicon tetrachloride, oxygen, and dopant or dopants undergo reaction in the heat provided by the hydrogen-free plasma. Since hydrogen is not used as the fuel gas, the problem of OH formation in the resultant preform is greatly reduced. Since plasmas generate high temperatures, on the order of 10°–30,000° C., care must be exercised in introducing the precursor materials into that portion of the plasma or in a region adjacent to the plasma where the temperature is best suited for the formation of the doped silica particles.

The use of a plasma as the heat source in the silica-forming reaction reduces the problem associated with the formation of the OH ions. As can be appreciated, it would be desirable to fully utilize the energy required to form the plasma in the production of doped optical material.

SUMMARY OF THE INVENTION

In accordance with the present invention, an improved method is provided for forming doped optical material using a plasma formed in a plasma torch or equivalent containment chamber by introducing a solid dopant directly into the plasma for vaporization or ionization. The vaporized dopant is passed toward a lower temperature region where silica precursor gases are introduced to undergo reaction in the presence of the plasma-vaporized dopant to form doped silica particles to be deposited onto a suitable substrate or otherwise accumulated. If desired, the dopants and a high-purity glass can be introduced directly into the plasma for vaporization with the vaporized components resulting in the formation of doped glass particles.

The plasma torch of the present invention includes a containment chamber into which a plasma starting gas, such as argon, is introduced. A coupling device in the form of an RF induction coil is provided to direct electromagnetic energy into the starting gas to generate a plasma in the usual manner. An entry port is provided for the introduction of a solid dopant, for example, in rod or particulate form, directly into the plasma for vaporization or ionization. Additional entry points are provided for the introduction of silica precursor gases in the form of silicon tetrachloride and oxygen to cause a silica-forming reaction in the presence of the vaporized dopant to result in doped silica particles which are then accumulated on a suitable substrate to form a preform. Where desired, high-purity glass in solid or particulate form, rather than the precursor gases, can be introduced into the plasma to form doped glass particles.

The plasma torch and process of the present invention operates with high energy efficiency since the substantial energy required for forming the plasma is fully utilized in the vaporization or ionization of the solid dopant to make available a comparitively large amount of vaporized dopant material for combination with introduced silica precursor gases to glass to result in increased particle production.

A principal objective of the present invention is, therefore, the provision of an improved method for forming doped optical preforms and apparatus therefor. Other objects and further scope of applicability of the present invention will become apparent from the detailed description to follow, taken in conjunction with the accompanying drawings, in which like parts are designated by like reference characters.

DESCRIPTION OF THE PREFERRED EMBODIMENT

Figure 1:
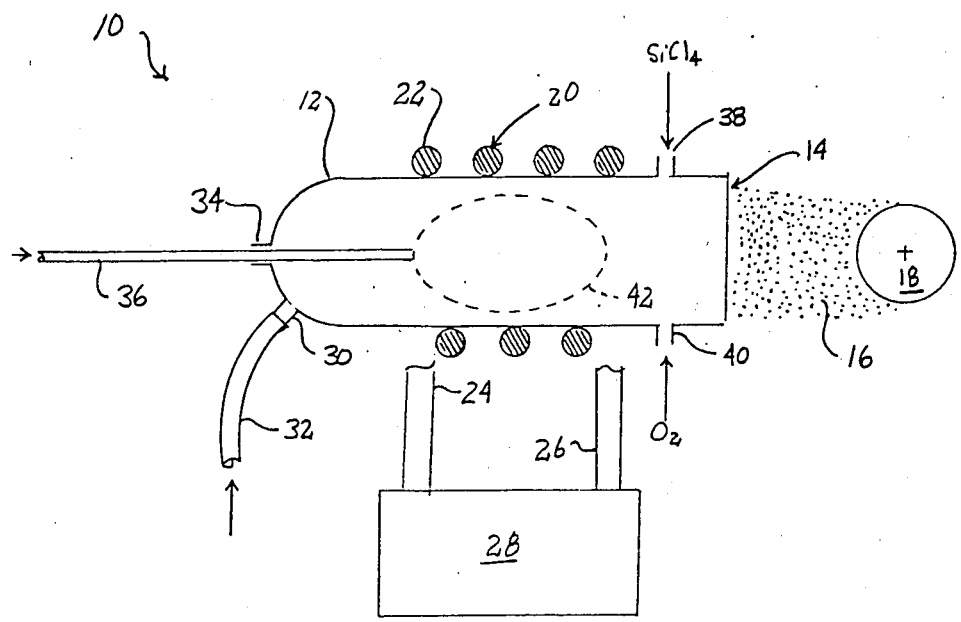
FIG. 1 illustrates a first embodiment of a plasma torch, in schematic form, for forming doped silica particles by plasma chemical vapor deposition.

A plasma torch in accordance with the present invention is illustrated in schematic form in FIG. 1 and designated generally therein by the reference character 10. As shown, the plasma torch 10 includes a plasma confining burner tube 12 having, on its right side, an open discharge end 14 from which doped silica particles, illustrated generally at 16, are discharged. The left end of the burner tube 12 is generally closed except for entry ports through which starting materials are introduced into the interior of the burner tube, as described more fully below. The burner tube 12 is preferably fabricated from a material, such as silica, that is compatible with the plasma chemical vapor deposition process to minimize the presence of possible contaminants. In FIG. 1, the plasma torch 10 is shown having a generally horizontal alignment, this alignment presented for the purpose of illustration only. The doped silica particles 16 discharged from the open end 14 of the burner tube 12 are preferably directed onto a target substrate 18, such as a silica starting cylinder, where the silica particles 16 produced by the plasma torch 10 accumulate.

A radio frequency (RF) induction coil 20 surrounds the outside of the burner tube 12 for applying electromagnetic energy to the plasma forming gas introduced into the interior of the burner tube. The RF coil 20 is defined by a plurality of helical windings 22 and is connected by conductors 24 and 26 to a RF source 28 which generates RF energy sufficient to form a plasma as described below.

The burner tube 12 is provided with various openings or entry ports through which starting materials can be introduced for processing into the doped silica particles. At the left end of the burner tube 12 an entry port 30 is provided for introducing a plasma forming gas, such as argon, helium, oxygen, or a mixture thereof, through a conduit 32 from an appropriate source (not shown). Additionally, another entry port 34 is provided for introducing various dopants 36 in solid form into the burner tube 12. In FIG. 1, the dopant 36 is shown as an exemplary rod for the purpose of illustration. As can be appreciated, the dopant 36 can be introduced through the entry port 34 in granular or powdered form using appropriate feed devices (not shown). Two additional entry ports 38 and 40 are provided between the RF coil 20 and the discharge end 14 of the burner tube 12 through which silica precursor gases, viz., silicon tetrachloride and oxygen, are introduced into the burner tube 12. The various entry ports have been shown in generalized form for the purpose of illustration only. If desired, multiple entry ports for each type of starting material to be introduced into the burner tube 12 can be provided and located differently from the ports illustrated in FIG. 1.

The RF source 28 supplies a high frequency current at a high voltage (e.g., 2 MHz and 10 KV) to the coil 20. When a plasma forming gas, argon in the case of the preferred embodiment, is introduced into the burner tube 12 a plasma flame zone, indicated generally in FIG. 1 at 42, is established. As is known the plasma will attain a very high temperature, typically on the order of 10,000° C. Depending upon the design of the burner tube 12, cooling can be provided to prevent softening of the tube walls. For example, a shield gas flow can be introduced into the burner tube 12 to thermally isolate the tube walls from the plasma. Additionally, the RF coil 20 can be cooled by forming the coil from hollow tubing and passing a cooling fluid through the tubing to remove excess heat energy.

In order to manufacture doped silica using the apparatus of FIG. 1, the plasma forming gas is introduced into the burner tube 12 through the conduit 32 and electrical energy is applied to the introduced gas by the RF coil 20 with energy supplied by the RF source 28. The plasma zone 42 preferably occupies a central region within the burner tube 12 spaced from the inside surface of the tube walls. A dopant 36, in solid form, is then introduced directly into the plasma zone 42 through the entry port 34. The dopant 36 can take the form of a elongated wire or rod which can be advanced directly into the highest temperature portion of the plasma. Because of the very high temperatures attained, the solid dopant 36 is vaporized or ionized, depending upon the material, with the dopant atoms or ions moving toward the discharge end 14 of the burner tube 12. The feed rate of the dopant 36 can be adjusted to control the dopant vaporization rate.

As the solid dopant 36 is vaporized in the plasma, silicon tetrachloride vapor and oxygen are introduced into the burner tube 12 through the ports 38 and 40, respectively. Silicon tetrachloride vapor can be generated by appropriate heating of the liquid and conducting the vapor into the burner tube 12 through the entry port 38. The position of the entry ports 38 and 40 is chosen to introduce the silicon tetrachloride vapor and oxygen into a temperature zone between 1400° and 1800° C. to ensure reaction at optimum oxidation temperatures.

As is known in the art, the silicon tetrachloride reacts with the oxygen via the reaction:

$$SiCl_4 + O_2 \rightarrow SiO_2 + 2Cl_2$$

Since the oxidation occurs in the presence of the previously vaporized dopant 36, the silica reaction products contain selected concentrations of the dopant. The feed rates of the dopant 36, the silicon tetrachloride, and the oxygen can be separately controlled to control the concentration of the dopant 36 in the resulting silica particles 16 as well as the overall production rate. The silica particles 16 are discharged from the discharge end 14 of the burner tube 12 toward and onto the substrate 18. During deposition, the substrate 18 can be rotated or otherwise moved relative to the discharge end 14 of the burner tube 12 to ensure a uniform coating. As the coating on the substrate accumulates, the concentration of the dopant 36 can be varied to vary the index of refraction of the resulting silica. When a sufficient quantity of silica particles has accumulated on the substrate 18, the substrate can be removed and the remaining accumulation of silica consolidated into a clear preform that can be drawn into a fiber in the usual manner.

The apparatus and method described above has several advantages over prior processes. Since very high temperatures are employed, dopants that have been difficult to introduce into optical materials can be vaporized or ionized readily in the very high temperature plasma. Such materials include neodymnium, urbium, and terbium and other materials. Also, the dopants are vaporized in the highest temperature portion of the plasma so that the electrical energy used to form the plasma is fully utilized to provide an increase in energy efficiency over prior plasma chemical vapor deposition techniques.

Figure 2:
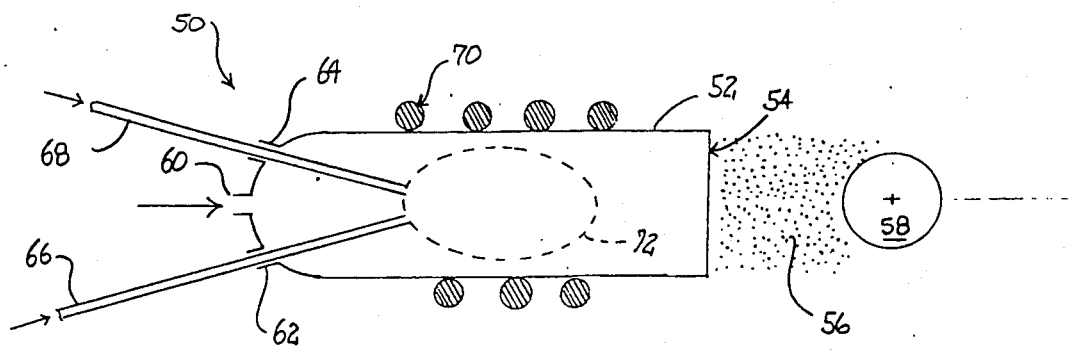
FIG. 2 illustrates a second embodiment of a plasma torch, also in schematic form, for foming doped optical materials including doped optical glasses.

Another embodiment of the present invention is illustrated in FIG. 2 and allows the formation of doped glasses without chemical vapor deposition. As shown in FIG. 2, a plasma torch 50 includes a burner tube 52 having an open discharge end 54 for directing doped glass particles, indicated generally at 56, onto a substrate 58. The burner tube 52 is closed generally at its left end except for entry points 60, 62, and 64 through which, respectively, a plasma forming gas, a dopant 66, and a glass starting material 68 are introduced into the interior of the burner tube 52 as explained below. An RF induction coil 70, having a structure and function analogous to that described above for the plasma torch of FIG. 1, surrounds the burner tube 52 and creates a plasma region, generally indicated at 72.

The plasma torch 50 operates to form doped optical material by direct vaporization of the dopant 66 and glass starting material 68. A plasma forming gas, such as argon, is introduced into the burner tube 52 through the entry port 60 with RF energy provided by the RF coil 70 to establish the plasma zone 72. A dopant 66 and a glass starting material 68, both in rod form, are advanced into the burner tube 12 through the entry ports 62 and 64, respectively. As the two materials enter the high temperature plasma zone 72 they are both vaporized in the presence of one another, with the materials passing toward the lower temperature discharge end 54 where the materials reform into doped glass particles 56 for deposition onto the substrate 58. The feed rates of both the dopant 66 and the glass starting material 68 can be varied to control the dopant concentration as well as the overall production rate.

Thus it will be appreciated from the above that as a result of the present invention, a highly effective method for forming doped optical preforms and apparatus therefor is provided by which the principal objective, among others, is completely fulfilled. It will be equally apparent and is contemplated that modification and/or changes may be made in the illustrated embodiment without departure from the invention. Accordingly, it is expressly intended that the foregoing description and accompanying drawings are illustrative of preferred embodiments only, not limiting, and that the true spirit and scope of the present invention will be determined by reference to the appended claims.

What is claimed is:

1. A method for forming an optical fiber preform comprising the steps of:
    forming a plasma;
    introducing a solid dopant into the plasma to effect vaporization thereof;
    introducing silica precursor gases into the vaporized dopant in a temperature range for effecting reaction thereof to form doped silica particles; and
    accumulating the doped silica particles on a substrate.

2. The method of claim 1, wherein said first-mentioned introducing step further comprises introducing the solid dopant into the plasma in particulate form.

3. The method of claim 1, wherein said second-mentioned introducing step further comprises introducing silicon tetrachloride and oxygen into the vaporized dopant.

4. The method of claim 1, wherein said first-mentioned introducing step further comprises controlling the rate of introduction of said dopant to control the percentage concentration thereof in the doped silica.

5. The method of claim 1, wherein said second-mentioned introducing step further comprises introducing silicon tetrachloride and oxygen into the vaporized dopant and controlling the rate of introduction thereof to control the percentage concentration of the introduced dopant in the doped silica particles.

6. The method of claim 1, wherein said plasma is formed by RF induction into a plasma-forming gas.

7. The method of claim 6, wherein said plasma forming gas is argon.

8. A method for forming an optical fiber preform comprising the steps of:
    forming a plasma;
    introducing a solid dopant material and a solid glasseous material into the plasma to effect vaporization thereof;
    passing the vaporized glasseous and solid dopant material to a temperature zone lower than that of the plasma to allow formation of doped glasseous particles; and
    accumulating the doped glasseous particles on a substrate.

9. The method of claim 8, wherein said introducing step further comprises controlling the rate of introduction of the dopant and the glasseous material to control the percentage concentration of the dopant in the doped glasseous particles.

10. The method of claim 8, wherein said plasma is formed by RF induction into a plasma-forming gas.

11. The method of claim 10, wherein said plasma-forming gas is argon.

* * * * *